United States Patent [19]
Komatsu

[11] Patent Number: 6,114,681
[45] Date of Patent: Sep. 5, 2000

[54] AUTOMATIC FOCUS CONTROL METHOD AND AUTOMATIC FOCUS CONTROL SYSTEM HAVING IN FOCUS AND OUT OF FOCUS STATES DETECTION

[75] Inventor: Fumio Komatsu, Fuchu, Japan

[73] Assignee: Kabushiki Kaisha Toshiba, Kawasaki, Japan

[21] Appl. No.: 09/090,249

[22] Filed: Jun. 4, 1998

[30] Foreign Application Priority Data

Jun. 4, 1997  [JP]  Japan .................................. 9-146363

[51] Int. Cl.⁷ ...................................................... G02B 7/04
[52] U.S. Cl. ................................... 250/201.3; 250/559.44
[58] Field of Search ........................... 250/201.3, 559.44, 250/201.2, 559.4, 306, 311; 356/39, 244; 382/206, 181

[56] References Cited

U.S. PATENT DOCUMENTS

4,045,772  8/1977  Bouton et al. .............................. 356/39

*Primary Examiner*—Que T. Le
*Attorney, Agent, or Firm*—Oblon, Spivak, McClelland, Maier & Neustadt, P.C.

[57] ABSTRACT

An automatic focus control system comprises an electron beam lens column 1, a device control apparatus 2, and a host computer 3. In the host computer 3, an image processing section 32 and so on are provided. In case of measuring the critical dimension of the patterns in the wafer, after performing the global alignment adjustment, the power spectrum is calculated based on the SEM image of each measuring point in the wafer. After that, in case that the high-frequency component is included more than a prescribed standard value, without performing the automatic focus adjustment, the process for the pattern recognition is performed, and in case that the high-frequency component is included less than the standard value, the process for pattern recognition is performed just before the automatic focus adjustment. Therefore, it is possible to decrease the frequency (times) which performs the process for automatic focus adjustment; as a result, the throughput for measuring is improved.

12 Claims, 7 Drawing Sheets

AUTOMATIC FOCUS CONTROL METHOD AND AUTOMATIC FOCUS CONTROL SYSTEM HAVING IN FOCUS AND OUT OF FOCUS STATES DETECTION

BACKGROUND OF THE INVENTION

1. Field of the Invention

The present invention relates to automatic focus control technique of an optical microscope and an electron microscope; for example, the present invention is utilized to a system measuring critical dimension of minute pattern, that is, a critical dimension SEM and so on.

2. Description of the Related Background Art

In semiconductor production lines, in order to measure and control the critical dimension of the minute pattern, a critical dimension SEM using electron beam is utilized. Such a kind of the SEM is now completely automated. In case of measuring the critical dimension of the pattern, at each measuring point in a wafer, the process for automatic focus adjustment is performed, and then the measurement of the pattern's critical dimension is performed. The reason why the process for automatic focus adjustment is performed at each measuring point is a warp's amount of the wafers is normally larger than the depth of focus of the SEM, which is about 1 μm.

In case it takes long time to perform automatic focus adjustment process, it is unable to improve throughput for the critical dimension's measurement. Accordingly, the method which shortens the time necessary to perform the process for automatic focus adjustment by providing an optical Z-sensor mechanism and so on is also being examined.

However, in order to perform the ultimate focus control, it is necessary to control an object lens composed of an electromagnetic coil and so on. It takes the processing time of about 10 seconds per a focus control. Accordingly, in case of performing the process for automatic focus adjustment, the time of (10 seconds * the number of the measuring point) is required.

Thus, in case the process for automatic focus adjustment is performed at each measuring point, it is unable to improve the throughput of the critical dimension's measurement. Particularly, if the wafer's diameter becomes larger in the future, the number of the measuring points also increases. Therefore, the measuring time per a wafer becomes longer.

Because the electron microscope irradiates the electron beam on the wafer, the surface of the wafer temporarily takes a charge. Consequently, the impurity of the floating positive ion is deposited on the surface of the wafer to contaminate the surface of the wafer. Accordingly, it is desirable to decrease the amount of irradiation of the electron beam as possible. Because the electron beam has to be irradiated even for the purpose of performing the process for automatic focus adjustment, the surface on the wafer is terribly contaminated when the process for automatic focus adjustment is performed.

SUMMARY OF THE INVENTION

Therefore, an object of the present invention is to provide automatic focus control method and automatic focus control system capable of decreasing the frequency (times) which performs the process for automatic focus adjustment as possible and increasing throughput of production.

The present invention provides an automatic focus control method capable of selecting whether or not to perform an process for an automatic focus adjustment for a measuring object set to a microscope; wherein:

whether or not the measuring object set to said microscope is in focus is detected;

in case of having determined to be in focus, a process for pattern recognition of said measuring object without performing automatic focus adjustment of the measuring object is performed;

in case of having determined to be out of focus, after the automatic focus adjustment has been performed at the point, the process for pattern recognition is performed.

Further, the present invention provides an automatic focus control system including an automatic focus adjustment means for performing automatic focus adjustment for a measuring object set to a microscope, and a pattern recognition means for performing a process for pattern recognition of said measuring object, comprising:

a focus adjustment state detecting means for detecting whether or not said measuring object set to the microscope is in focus;

an automatic focus control means for in case of having determined to be in focus, performing the process for pattern recognition by said pattern recognition means without performing the automatic focus adjustment, and in case of having determined to be out of focus, performing the process for pattern recognition after having performed the automatic focus adjustment at the point.

In case the ratio of frequency component equal to or higher than a prescribed frequency in the power spectrum is smaller than a prescribed standard value, because the present system performs the process for pattern recognition without performing the process for automatic focus adjustment, it is possible to shorten the measuring time of the measuring object and improve the throughput. Particularly, like the wafer with a large diameter, in case the measuring object has many measuring points and so on, the present invention is of great advantage.

By the way, in case of using the electron microscope for the measurement, because the electron beam has to be irradiated to the measuring object, the impurity is tend to deposit on the surface of the measuring object. On the other hand, because the present invention can decrease the number of times for performing the process for automatic focus adjustment, it is possible to decrease the amount of irradiation of the electron beam; consequently, it is possible to decrease the contamination on the surface of the measuring object.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of a production system according to the present invention will be described in detail below.

Figure 1:
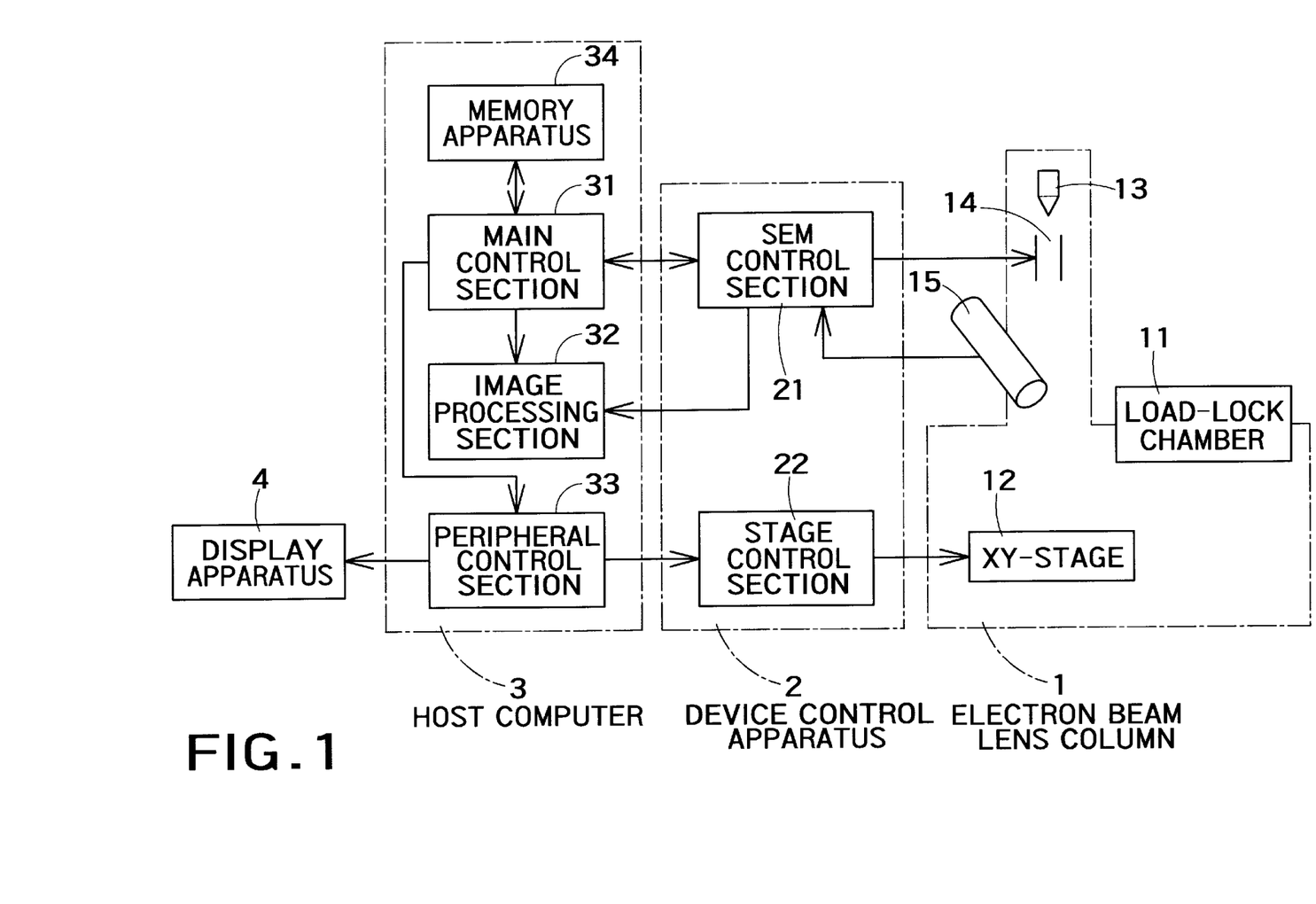
FIG. 1 is a block diagram of a preferred embodiment of a automatic focus control system.

FIG. 1 is a block diagram of a preferred embodiment of a automatic focus control system according to the present invention. The automatic focus control system shown in FIG. 1 is a system to measure critical dimension by using SEM (Scanning Electron Microscopy) The automatic focus control system is divided into an electron lens column 1, a device control apparatus 2, and a host computer 3. In a specimen chamber, a load-lock chamber 11 which puts in and off the specimen (measuring object), an XY stage 12 on which the specimen is set, an electron beam irradiating apparatus 13 which irradiates the electron beam to the specimen, a deflection apparatus 14 which controls the direction to irradiate the electron beam, and a secondary electron detector 15 which detects secondary electrons from the specimen are provided.

The device control apparatus 2 comprises an SEM control section 21 which controls the deflection apparatus 14 and the secondary electron detector 15, and a stage control section 22 which controls moving direction and moving velocity of XY stage 12. The SEM control section 21 outputs an analog signal (SEM image) in accordance with the amount of the secondary electron detected by the secondary electron detector 15.

The host computer 3 comprises a main control section 31 which performs all of control in the present system, an image processing section 32 which performs imaging analysis for the measuring object, a peripheral control section 33 which performs control for display of display apparatus 4, control of XY-stage 12 and so on, and a memory apparatus 34.

Figure 2:
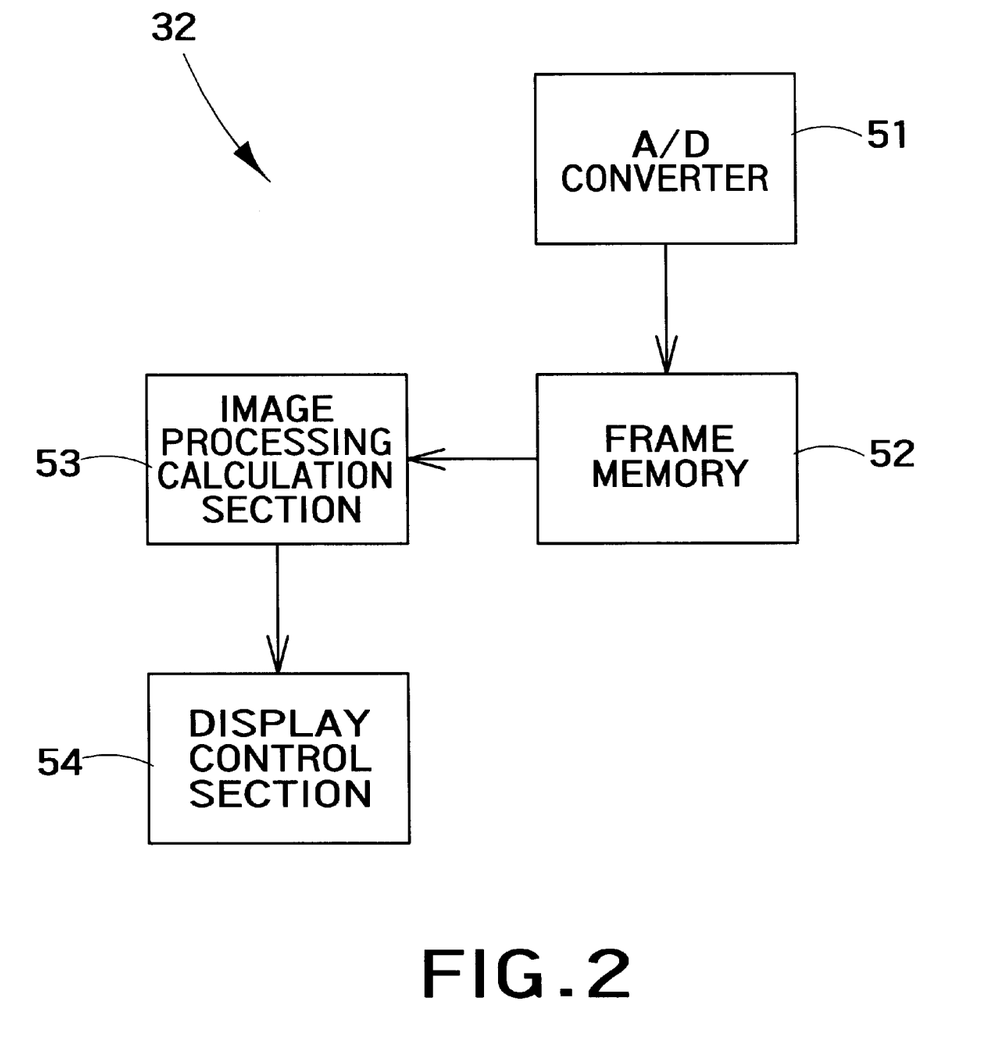
FIG. 2 is a block diagram showing the detail configuration of the image processing section.

FIG. 2 is a block diagram showing the detail configuration of the image processing section 32 in the host computer 3 shown in FIG. 1. The image processing section 32 comprises an A/D converter 51 which converts an SEM image outputted from the SEM control section 21 into digital data, a frame memory 52 which stores the converted digital data, an image processing calculation section 53 which performs filtering process and so on, and a display control section 54 which performs generation and so on of the image data displayed to the display apparatus 4 and so on.

Figure 3:
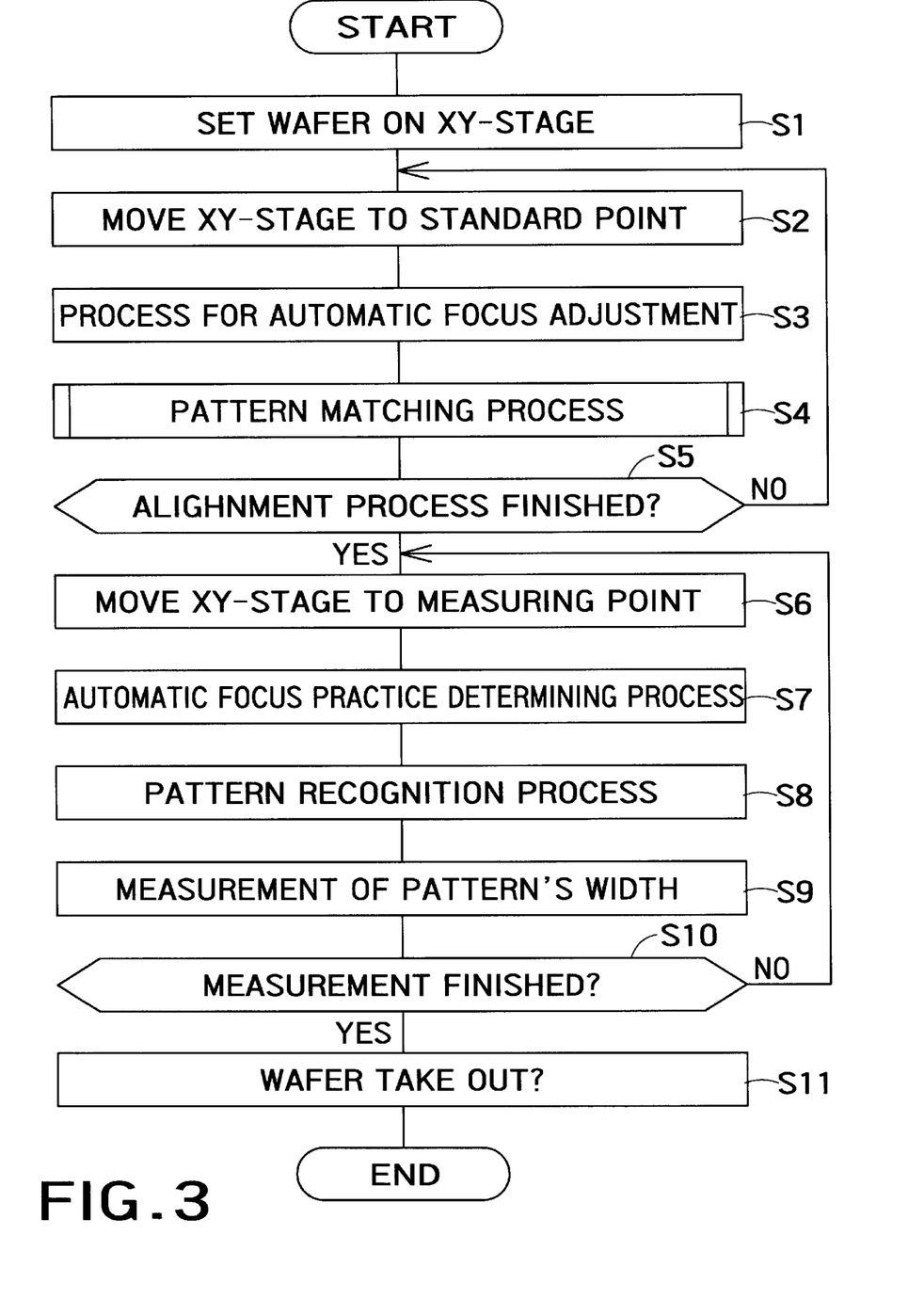
FIG. 3 is a main flowchart showing process and operation of the present automatic focus control system shown in FIG. 1.

FIG. 3 is a main flowchart showing process and operation of the present automatic focus control system shown in FIG. 1. As follows, the operation of the present system will explain based on this flowchart.

First of all, in step S1, the wafer which is the measuring object is set on the XY-stage 12. Next, in step S2, the XY-stage 12 is moved in order to perform the process for automatic focus adjustment at a standard point set in the wafer in advance, and then the process for automatic focus adjustment is performed at this standard point. In case of the state of best focus, that is, the state which is in focus, in step S4, the pattern matching process is performed on the basis of the image of the standard point, and then the location's adjustment (alignment) is performed at the standard point. The detail content of the pattern matching process will be described later.

Next, in step S5, whether or not the pattern matching process has been performed at all of the standard points prescribed in advance is determined. That is, whether or not the alignment adjustment has finished is determined. If there is any standard point which has never measured, the process of step S2 is performed.

Thus, in step S1 through S5, the alignment adjustment is performed at each standard point set to a plurality of different places in the wafer in advance. Such adjustment is generally called global alignment adjustment.

After the pattern matching process has been performed at all standard points, the process for measuring the critical dimension is performed as shown from step S6 onward. In step S6, the XY-stage 12 is moved at the measuring point prescribed in advance. Next, in step S7, the process, which determines whether or not the process for automatic focus adjustment is performed at the measuring point prescribed in advance, is performed. This process is called an automatic focus practice determining process.

The purpose of the process for automatic focus adjustment is to raise the accuracy and confidence of pattern recognition which is performed based on the SEM images of the specimen. However, not infrequently, there is case which is already in focus to the level not affected on the accuracy of pattern recognition. In this case, there is almost no sense to perform the process for automatic focus adjustment, in spite of wasting time. That is, it is undesirable to make it a indispensable condition that the process for automatic focus adjustment is performed. Therefore, the automatic focus practice determining process determines whether or not to perform the process for automatic focus adjustment in advance. The automatic-focus practice determining process will be described later in detail.

After the process of step S7 has finished, the image of the measuring point has taken in, and then the imaging analysis is performed in step S8. Next, in step S9, the measurement of the critical dimension of the pattern's width is performed based on the result of the analysis. Next, in step S10, whether or not the measurement of the critical dimension has been performed at all of the measuring points is determined. If there is any measuring point which has not yet been measured, the process of step S6 is performed. On the other hand, if the measurement of the critical dimension has been performed, the process which carries out the wafer is performed in step S11.

Thus, in step S6 through S11 in FIG. 3, the power spectrum is calculated based on the SEM images of each measuring point in the wafer, and in case the high-frequency component more than a prescribed standard value is included in the power spectrum, it is determined to be in focus, and the process for automatic focus adjustment is omitted. Accordingly, it is possible to decrease the frequency (times) which performs the process for automatic focus adjustment and improve the throughput for the measurement of the pattern's critical dimension and so on.

Figure 4:
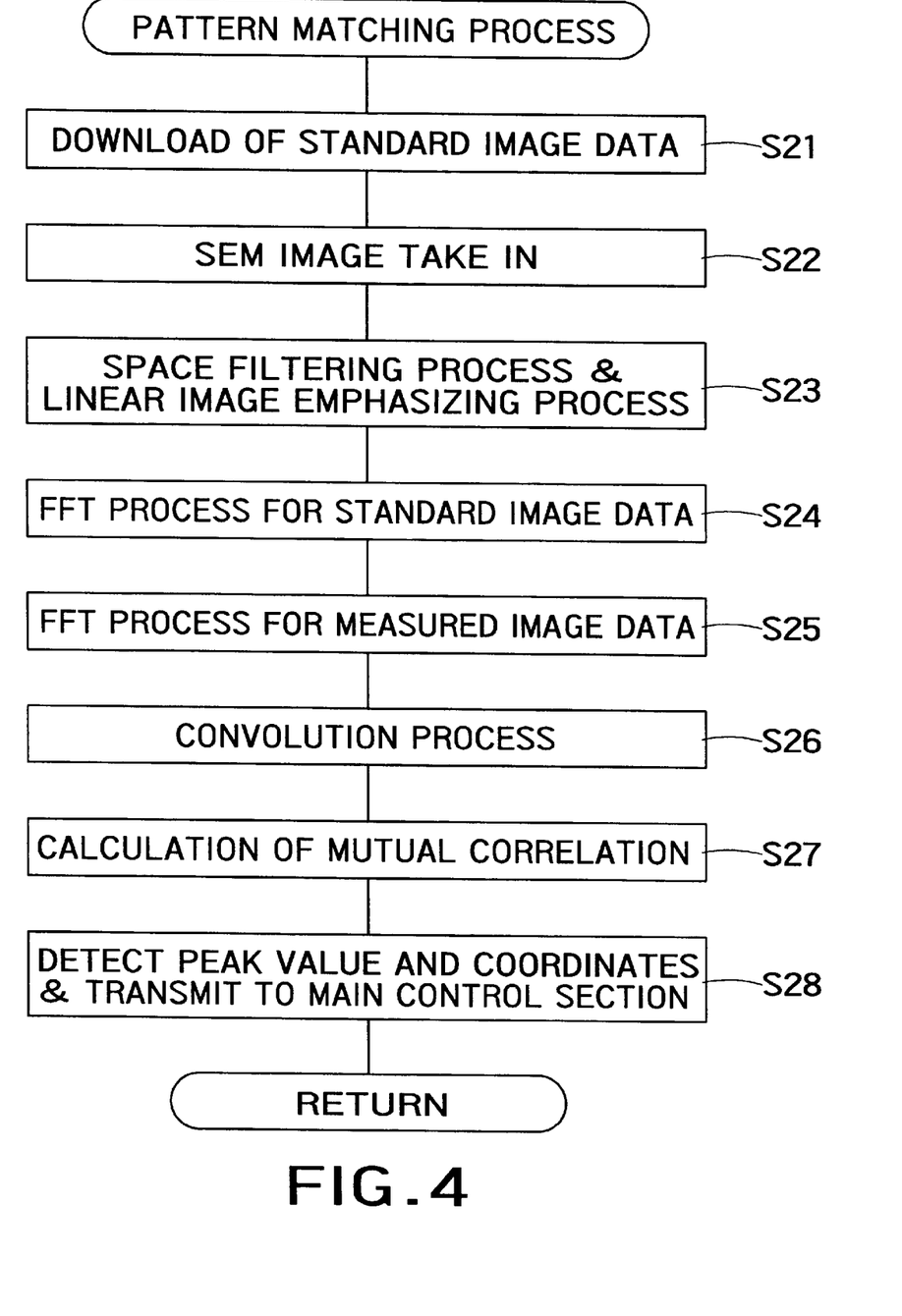
FIG. 4 is a detail flowchart of the pattern matching process in step S4.

FIG. 4 is a detail flowchart of the pattern matching process in step S4. First of all, in step S21, a standard image data with correspondence to the standard point is downloaded from the memory apparatus 34 in the host computer 3. Next, in step S22, the SEM image of the standard point in the wafer, which is called a measured image data as follows, is taken in the image processing section 32 via the SEM control section 21. The measured image data taken in the image processing section 32 is an analog data with correspondence to the secondary electron which has been emitted from the wafer and detected by the secondary electron detector 15.

Next, in step S23, a space filtering process and a linear image emphasizing process are performed. The space filtering process is the process which removes the frequency components including noise, and the linear image emphasizing process is the process which emphasizes the contrast of the pattern.

Figure 5:
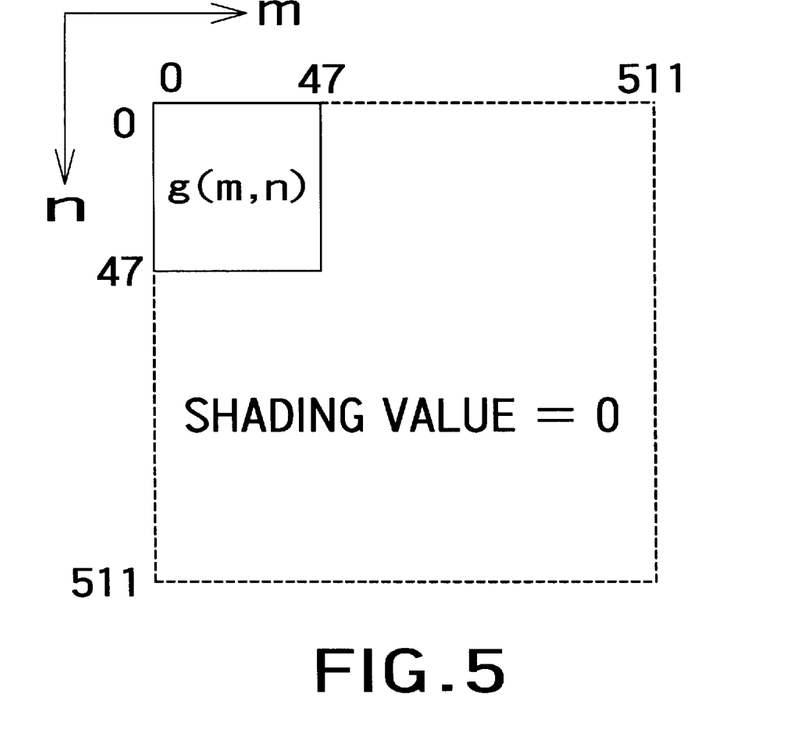
FIG. 5 is a diagram describing the coordinates of the standard image data.

Next, in step S24, a Fourier transform process (FFT process) is performed for the standard image data (template) downloaded by step S21. When the function with correspondence to the standard image data is g (m, n), and the function after performing the FFT process is G (m, n), the relationship of equation (1) is established. In equation (1), (m, n) expresses the location of the picture element (pixel) shown in FIG. 5, where $0 \leq m \leq 511$, and $0 \leq n \leq 511$.

$$G(m, n) = F\{g(m, n)\} \quad (1)$$
$$= \sum_{x=0}^{M-1} \sum_{y=0}^{N-1} g(x, y) \times e^{\frac{-j2\pi x_m}{M}} \times e^{\frac{-j2\pi y_n}{N}}$$
$$= \sum_{x=0}^{511} \sum_{y=0}^{511} g(x, y) \times e^{\frac{-j2\pi x_m}{511}} \times e^{\frac{-j2\pi y_n}{511}}$$

Next, in step S25, the FFT process is performed for the measured image data taken by step S22. When the function with correspondence to the measuring image data is f (m, n), and the function after performing the FFT process is F (m, n), the relationship of equation (2) is established.

$$F(m, n) = F\{f(m, n)\} \quad (2)$$
$$= \sum_{x=0}^{511} \sum_{y=0}^{511} f(x, y) \times e^{\frac{-j2\pi x_m}{511}} \times e^{\frac{-j2\pi y_n}{511}}$$

Next, in step S26, the process which composes the standard image data G (m, n) and the measured image data F (m, n), that is, a convolution process is performed. When the function after the convolution is R (m, n), the relationship of equation (3) is established.

$$R(m, n) = F(m, n) \otimes G(m, n) \quad (3)$$
$$= \sum_{m=0}^{511} \sum_{n=0}^{511} F(m, n) \times \overline{G(m, n)}$$

Next, in step S27, as shown in equation (4), a mutual correlation r (m, n) is calculated by performing a reverse FFT process for the function R (m, n).

$$r(m, n) = F^{-1}\{R(m, n)\} \quad (4)$$
$$= \frac{1}{MN} \sum_{x=0}^{M-1} \sum_{y=0}^{N-1} R(x, y) \times e^{\frac{j2\pi x_m}{M}} \times e^{\frac{j2\pi y_n}{N}}$$

-continued
$$= \frac{1}{2^{18}} \sum_{x=0}^{511} \sum_{y=0}^{511} R(x, y) \times e^{\frac{j2\pi x_m}{511}} \times e^{\frac{j2\pi y_n}{511}}$$

Figure 6:
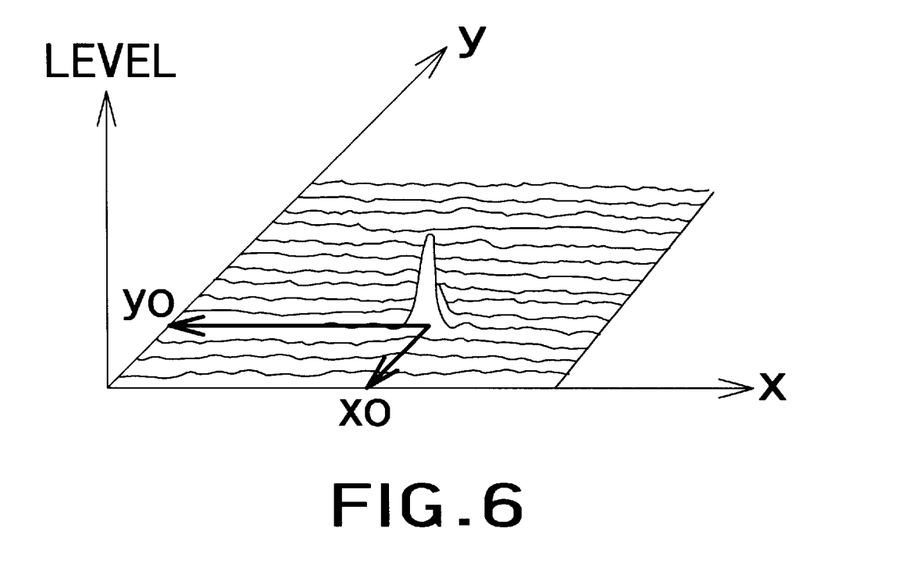
FIG. 6 is a diagram showing waveform of the mutual correlation r (m, n)

The mutual correlation r (m, n), which shows the result of the pattern matching, is expressed by the wave shown in FIG. 6. Next, in step S28, the value of the peak point in FIG. 6 and the coordinates (m, n) at the point are detected, and the detected result is sent to the main control section 31 in the host computer 3.

Thus, in the pattern matching process, the standard image data with correspondence to the standard point is provided in advance, and the FFT process is performed for the measured image data and the standard image data, respectively, and then both of data is compared to each other. Since the pattern matching process requires complicated calculation, it is desirable to perform the calculation by the image processing section 32, not by the main control section 31 in the host computer 3. If the calculation is performed by the image processing section 32, even while the image processing section 32 is calculating, the main control section 31 can perform the other job; accordingly, the processing effect of all of the system is improved.

Figure 7:
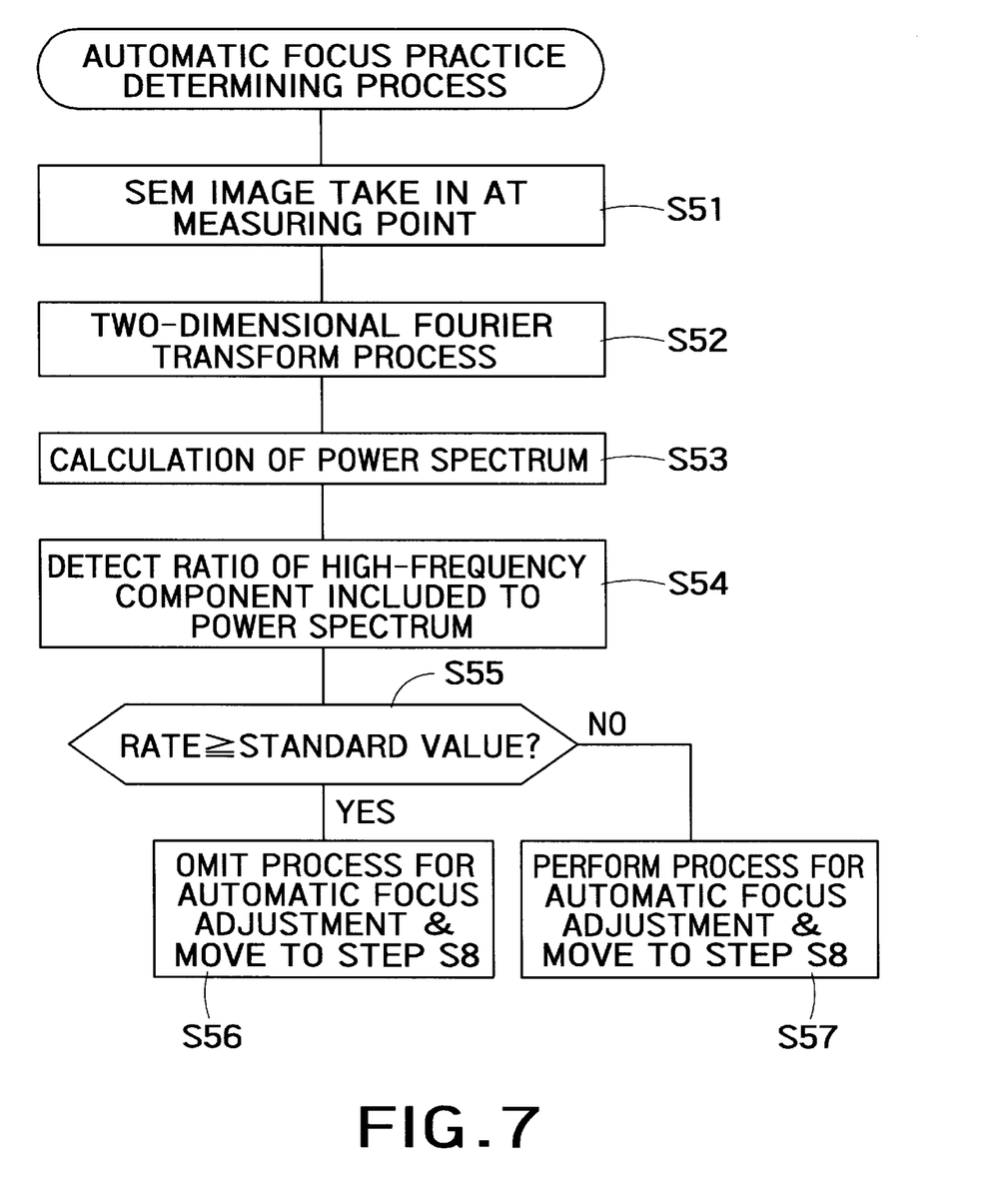
FIG. 7 is a detail flowchart of the automatic focus practice determining process showing in step S7 of FIG. 3.

FIG. 7 is a detail flowchart of the automatic focus practice determining process showing in step S7 of FIG. 3. First of all, in step S51, the SEM image with correspondence to the measuring point is taken in. The SEM image, which is analog data, is converted to digital data in the A/D converter 51, and then the digital data is stored to the frame memory 52.

Next, in step S52, a two-critical dimensional FFT process is performed for the image data stored to the frame memory 52. Next, in step S53, the frequency distribution, that is, the power spectrum is calculated based on the result of the two-critical dimensional FFT process.

In the state of defocus (i.e., being out of focus), the SEM image of the specimen is seemingly flat and smooth because of an expanse of the beam's diameter, and the high-frequency component in the FFT image which is obtained by performing the Fourier transform for the SEM image decreases. On the other hand, in case the image performed the Fourier transform is in focus, the signal component from the pattern, which is mainly composed of the low frequency component, and the noise component, which is composed of the high-frequency component, are mixed. Accordingly, it is possible to distinguish between the defocus's state and the best-focus's state by analyzing the frequency component of the image performed the Fourier transform.

Therefore, in step S53 of FIG. 7, the frequency distribution (power spectrum) is calculated based on a square root of a square's sum of a real number and a imaginary number of each frequency component which is obtained by the process of the two-critical dimensional Fourier transform, and then the ratio of the high-frequency component included in the power spectrum is detected in step S54.

Figure 8A:
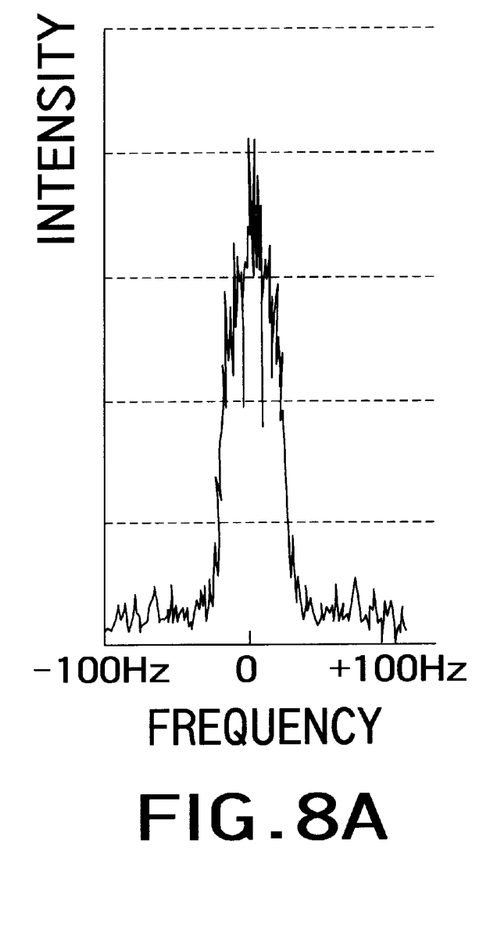
FIG. 8A is a diagram showing power spectrum in best-focus's state, and 8B is a diagram showing power spectrum in defocus's state.

FIG. 8A is a diagram showing the power spectrum in the state of the best-focus or its neighborhood. In FIG. 8A, the horizontal axis is frequency [Hz], and the vertical axis is the power's intensity. In FIG. 8A, the frequency component equal to or lower than 30 Hz is affected on the pattern's shape in the wafer, and the frequency component of 50–60 Hz depends on the noise from the power supply, which is called salt-and-pepper noise, and in which the noise due to the sampling is included.

Figure 8B:
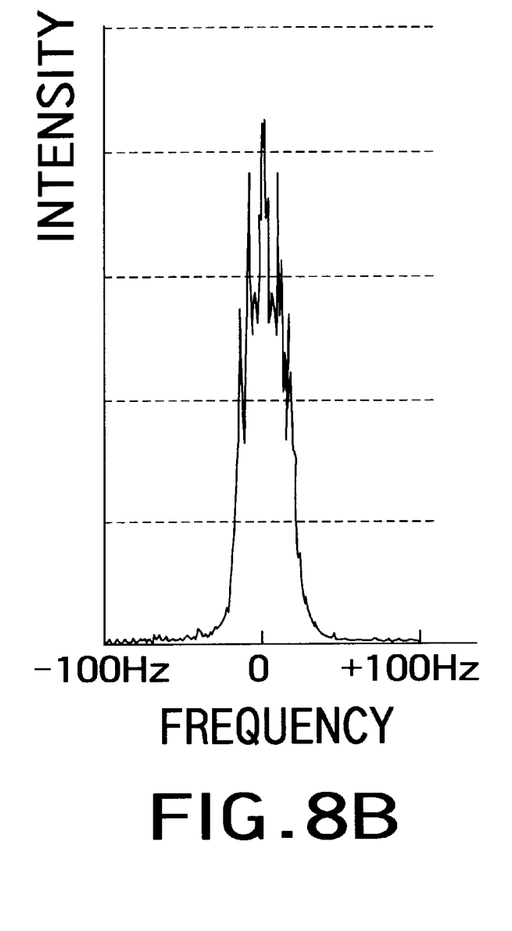

On the other hand, FIG. 8B is a diagram showing the power spectrum in the defocus's state. In the defocus's state, as an effect due to the expanse of the beam's diameter, the image which seemingly smoothes the SEM image is obtained; accordingly, the salt-and-pepper noise of the high-frequency component shown in FIG. 8A decreases. When the process for pattern recognition is performed at the defocus's state, there is case that it is impossible to perform the pattern recognition or the pattern recognition is erroneously performed. Therefore, before the process for pattern recognition is performed, it is desirable to perform the process for automatic focus adjustment.

Accordingly, in step S55 of FIG. 7, in case the high-frequency component, which is higher than 30 Hz and is not equivalent to the power supply frequency (50/60 Hz), is included more than a prescribed standard value, the present system determines to be the best-focus's state and omits the process for automatic focus adjustment. On the other hand, in case the high-frequency component higher than 30 Hz is included less than the prescribed standard value, the present system determines to be the defocus's state and performs the process for automatic focus adjustment.

Because the standard value in step S55 depends on the hardware's performance of the host computer 3 performing the process for pattern recognition, the image processing section 32 and so on, it is necessary to set the most suitable value at each hardware to use. For example, in case the image processing section 32 uses the algorism detecting the maximum value of coefficients of normalized correlation, about 10% of the sum of the intensity of the power spectrum, desirably 10–15%, is set as the standard value.

After the process of step S54 or S55 has finished, the process for pattern recognition in step S8 of FIG. 3 is performed.

Above mentioned embodiment performs forcedly the process for automatic focus adjustment, during the global alignment process (step S1 through S5 in FIG. 3), without performing the automatic focus practice determining process. However, it may perform the automatic focus practice determining process even during the global alignment process Therefore, the measuring time becomes short and the throughput is more improved.

In above mentioned embodiment, the example used the SEM has been described. However, the present invention is capable of applying even to the electron microscope and the optical microscope besides the SEM.

As above mentioned, because the standard value, which is used in order to judge whether or not the process for automatic focus adjustment is performed, changes by the operating condition and etc. of the hardware in use, it may arbitrarily change and set the standard value by using the keyboard and so on. As an rough aim of the standard value, it is desirable to set the standard value so that the result performed pattern recognition has an error less than a single pixel for the standard pattern.

Further, it is possible to construct the system so as to be able to arbitrarily select whether or not to perform the automatic focus practice determining process. Furthermore, instead of performing the process for automatic focus adjustment, it may provide a mode which performs the focus adjustment with manual operation.

In above mentioned embodiment, the example for performing the process for the two-critical dimensional Fourier transform has been explained. However, it may calculate the power spectrum based on the result of the process for one-critical dimensional Fourier transform.

Further, in above mentioned embodiment, because the example for performing the measurement of the critical dimension of the minute patterns in the wafer has been described, the measuring objects of the present invention is not limited to the wafer; for example, the present invention is applicable even to the detection of the pattern's defect on the printed board and so on.

What is claimed is:

1. An automatic focus control method capable of selecting whether or not to perform a process for an automatic focus adjustment for a measuring object set to a microscope; wherein:
   whether or not the measuring object set to said microscope is in focus is detected;
   in case of having determined to be in focus, a process for pattern recognition of said measuring object without performing automatic focus adjustment of the measuring object is performed;
   in case of having determined to be out of focus, after the automatic focus adjustment has been performed at that non-focal point, the process for pattern recognition is performed.

2. The automatic focus control method according to claim 1, wherein:
   the determination of whether or not being in focus is performed at each of a plurality of different points in said measuring object;
   in case of having determined to be in focus, the process for pattern recognition of said measuring object is performed without performing the automatic focus adjustment at that focal point;
   in case of having determined to be out of, after the automatic focus adjustment has been performed at that non-focal point, the process for pattern recognition is performed.

3. An automatic focus control method capable of selecting whether or not to perform a process for an automatic focus adjustment for a measuring object set to a microscope; wherein:
   a power spectrum is calculated based on one-critical dimensional or two-critical dimensional Fourier transform process for image of said measuring object imported to said microscope;
   if the ratio of frequency component equal to or higher than a prescribed frequency in the power spectrum is equal to or larger than a standard value at each of a plurality of points in said measuring object, the process for pattern recognition by said pattern recognition means is performed without performing the automatic focus adjustment by said automatic focus adjustment means; and
   if said ratio is smaller than said standard value, the process for pattern recognition by said pattern recognition means is performed after the process for automatic focus adjustment has been performed.

4. The automatic focus control method according to claim 3, wherein:
   said power spectrum is calculated at each of a plurality of points of said measuring points;
   whether or not the ratio of frequency component equal to or higher than said prescribed frequency is equal to or larger than said standard value is determined;
   at the point where the ratio is equal to or larger than said standard value, the process for pattern recognition of said measuring object is performed without performing the automatic focus adjustment;
   at the point where the ratio is smaller than said standard value, said process for pattern recognition is performed after automatic focus adjustment has been performed.

5. An automatic focus control system including an automatic focus adjustment means for performing automatic focus adjustment for a measuring object set to a microscope, and a pattern recognition means for performing a process for pattern recognition of said measuring object, comprising:

- a focus adjustment state detecting means for detecting whether or not said measuring object set to the microscope is in focus;
- an automatic focus control means for in case of having determined to be in focus, performing the process for pattern recognition by said pattern recognition means without performing the automatic focus adjustment, and in case of having determined to be out of focus, performing the process for pattern recognition after having performed the automatic focus adjustment at that non-focal point.

6. The automatic focus control system according to claim 5, wherein:

- said focus adjustment state detecting means detects whether or not each of a plurality of different points in said measuring object is in focus;
- said automatic focus control means determines whether or not to perform the process for pattern recognition at each of said points.

7. An automatic focus control system including an automatic focus adjustment means for performing automatic focus adjustment for a measuring object set to a microscope, and a pattern recognition means for performing a process for pattern recognition of said measuring object, comprising:

- a frequency component analyzing means for calculating a power spectrum based on the result performed one-critical dimensional or two-critical dimensional Fourier transform process for image of said measuring object taken in said microscope;
- an automatic focus control means for if the ratio of frequency component equal to or higher than a prescribed frequency in the power spectrum is equal to or larger than a standard value at each of a plurality of points of said measuring object, performing the process for pattern recognition by said pattern recognition means without performing the automatic focus adjustment by said automatic focus adjustment means, and if the ratio is smaller than said standard value, performing the process for pattern recognition by said pattern recognition means after having performed the process for automatic focus adjustment.

8. The automatic focus control system according to claim 7, wherein:

- said microscope is a scanning electron microscopy;
- said frequency component analyzing means detects said power spectrum at each of a plurality of points of said measuring object;
- said automatic focus control means determines whether or not the ratio of frequency component equal to or higher than a prescribed frequency in the power spectrum is equal to or larger than said standard value at each of a plurality of points in said measuring object, at the point where said ratio is equal to or larger than said standard value, performs the process for pattern recognition by said pattern recognition means, and at the point where said ratio is smaller than said standard value, after having performed the focus adjustment by said automatic focus adjustment means, performs the process for pattern recognition by said pattern recognition means.

9. The automatic focus control system according to claim 7, wherein:

- said automatic focus control means sets said prescribed standard value so that the error detecting amount of the pattern obtained by the process for pattern recognition by said pattern recognition means is less than a single pixel which is a unit to acquire image of said microscope.

10. The automatic focus control system according to claim 7, wherein said prescribed frequency is set based on the minimum frequency of noise component included in said power spectrum.

11. The automatic focus control system according to claim 7, wherein said prescribed frequency is higher than 30 Hz.

12. The automatic focus control system according to claim 7, comprising: at least two calculation processing apparatuses, wherein:

- the one of said calculation processing apparatuses is exclusively provided for the purpose in which said frequency component analyzing means performs the analysis of frequency.

* * * * *